United States Patent
Unger et al.

(10) Patent No.: US 12,528,135 B2
(45) Date of Patent: Jan. 20, 2026

(54) WIRE GUIDE MODULE, AND ULTRASONIC WIRE BONDER THEREWITH

(71) Applicant: Hesse GmbH, Paderborn (DE)

(72) Inventors: Andreas Unger, Verl (DE); Frank Walther, Paderborn (DE); Michael Broekelmann, Delbrueck (DE); Matthias Hunstig, Paderborn (DE)

( * ) Notice: Subject to any disclaimer, the term of this patent is extended or adjusted under 35 U.S.C. 154(b) by 0 days.

(21) Appl. No.: 18/086,065

(22) Filed: Dec. 21, 2022

(65) Prior Publication Data
US 2023/0123439 A1    Apr. 20, 2023

Related U.S. Application Data

(63) Continuation of application No. PCT/DE2021/100534, filed on Jun. 23, 2021.

(30) Foreign Application Priority Data

Jul. 3, 2020  (DE) ...................... 10 2020 117 641.4

(51) Int. Cl.
| | |
|---|---|
| B23K 20/00 | (2006.01) |
| B23K 20/10 | (2006.01) |
| B23K 20/14 | (2006.01) |

(52) U.S. Cl.
CPC ............ *B23K 20/004* (2013.01); *B23K 20/10* (2013.01); *B23K 20/14* (2013.01)

(58) Field of Classification Search
CPC .... B23K 20/005; B23K 20/004; B23K 20/10; H01L 2224/85205; H01L 24/78
See application file for complete search history.

(56) References Cited

U.S. PATENT DOCUMENTS

| | | | | |
|---|---|---|---|---|
| 3,347,442 A | * | 10/1967 | Reber | .................... H01L 24/78 257/784 |
| 3,627,192 A | * | 12/1971 | Killingsworth | ......... H01L 24/48 219/229 |
| 3,648,354 A | | 3/1972 | Mashino et al. | |
| 3,986,653 A | | 10/1976 | Gilding | |
| 4,928,871 A | * | 5/1990 | Farassat | .................. H01L 24/85 228/180.5 |
| 5,018,658 A | * | 5/1991 | Farassat | .................. H01L 24/85 228/4.5 |

(Continued)

FOREIGN PATENT DOCUMENTS

| | | |
|---|---|---|
| CN | 110783213 A | 2/2020 |
| CN | 210489578 U | 5/2020 |

(Continued)

OTHER PUBLICATIONS

Computer English translation of Tejima (JPH0547824A) (Year: 2024).*

(Continued)

*Primary Examiner* — Erin B Saad

(57) ABSTRACT

A wire guide module for an ultrasonic wire bonder, comprising a body made of a thermally stable metallic and/or ceramic material, wherein an elongated wire feed-through channel having a wire inlet opening and having a wire outlet opening is provided on the body, and comprising a guide tube provided in the wire feed-through channel. In addition, the invention relates to a thermosonic wire bonder having a wire guide module.

15 Claims, 9 Drawing Sheets

(56) References Cited

U.S. PATENT DOCUMENTS

| | | | | |
|---|---|---|---|---|
| 5,031,821 | A * | 7/1991 | Kaneda | H01L 24/78 228/180.5 |
| 5,190,206 | A * | 3/1993 | Miller | B23K 20/005 228/180.5 |
| 5,263,246 | A * | 11/1993 | Aoki | H01L 24/13 228/179.1 |
| 6,619,530 | B2 * | 9/2003 | Ushiki | B23K 20/004 228/180.5 |
| 7,451,905 | B2 * | 11/2008 | Bell | B23K 20/004 228/1.1 |
| 7,578,422 | B2 * | 8/2009 | Lange | H01L 24/78 228/1.1 |
| 7,954,689 | B2 * | 6/2011 | Kwan | H01L 24/78 228/904 |
| 11,121,114 | B2 * | 9/2021 | Sugiyama | B23K 20/10 |
| 2005/0150932 | A1 * | 7/2005 | Hosseini | B23K 26/20 228/180.5 |
| 2006/0175584 | A1 * | 8/2006 | Kwon | C04B 35/119 252/520.2 |
| 2008/0272178 | A1 * | 11/2008 | Kwan | H01L 24/85 228/45 |
| 2011/0104510 | A1 * | 5/2011 | Uno | H01L 24/43 428/576 |
| 2012/0031955 | A1 * | 2/2012 | Pham | H01L 24/85 228/49.5 |
| 2013/0119117 | A1 * | 5/2013 | McGrath | H01L 24/78 228/160 |
| 2015/0249063 | A1 * | 9/2015 | Sekine | B23K 20/005 228/4.5 |

FOREIGN PATENT DOCUMENTS

| | | |
|---|---|---|
| DE | 2628519 A1 | 12/1976 |
| JP | 2008198886 A | 8/2008 |

OTHER PUBLICATIONS

International Search Report dated Nov. 29, 2021 in corresponding application PCT/DE2021/100534.

* cited by examiner

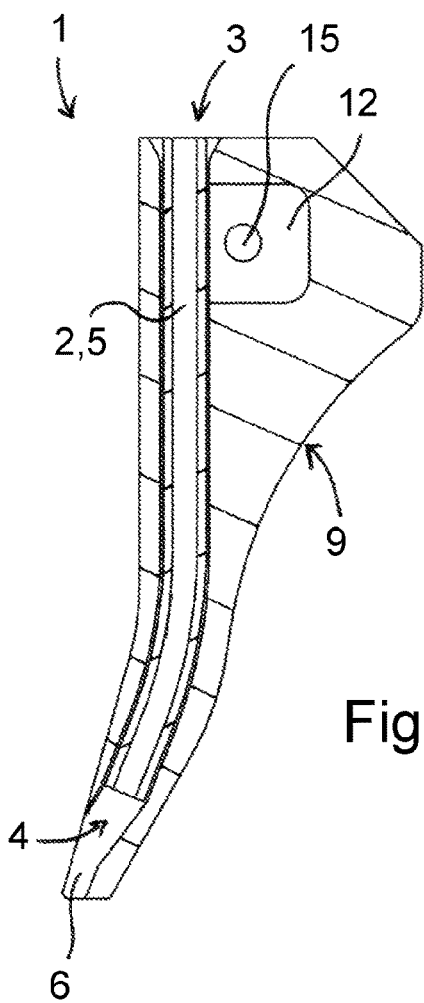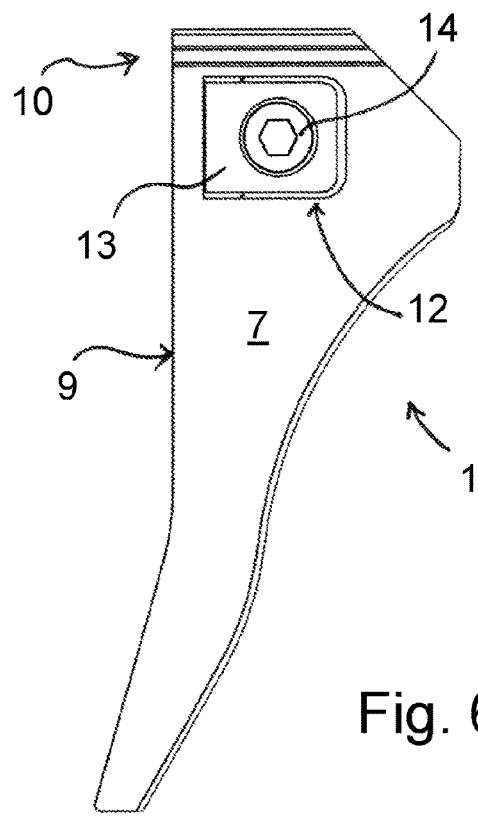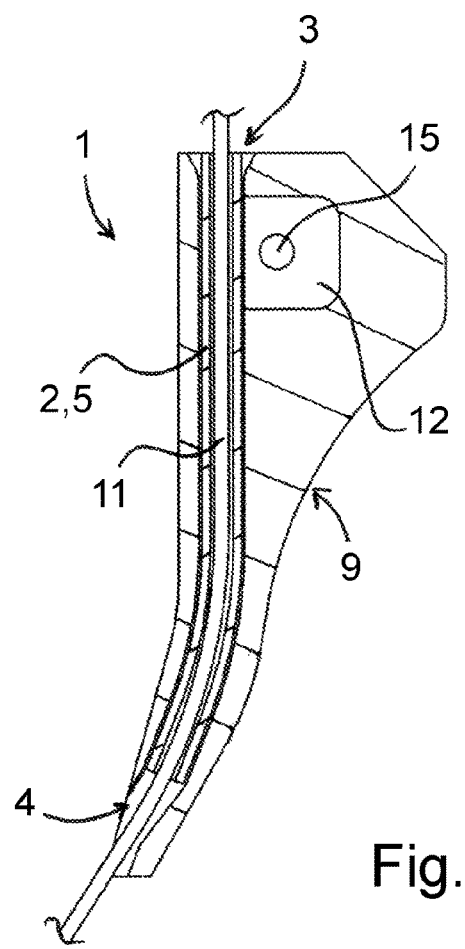
Fig. 6
Fig. 7
Fig. 8

WIRE GUIDE MODULE, AND ULTRASONIC WIRE BONDER THEREWITH

This nonprovisional application is a continuation of International Application No. PCT/DE2021/100534, which was filed on Jun. 23, 2021, and which claims priority to German Patent Application No. 10 2020 117 641.4, which was filed in Germany on Jul. 3, 2020, and which are both herein incorporated by reference.

BACKGROUND OF THE INVENTION

Field of the Invention

The present invention relates to a wire guide module for an ultrasonic wire bonder. Such wire guide modules are used in wire bonders to guide a bond wire through a movable bonding head of the wire bonder to a bonding tool, and to position the wire under the bonding tool of the wire bonder for the purpose of producing an electrically conductive bond connection. In addition, the invention relates to an ultrasonic wire bonder having a wire guide module.

Description of the Background Art

Conventional wire guide modules for wire bonders in use today are chiefly made of plastic, in particular of polyoxymethylene (POM), on account of the comparatively low costs and good sliding behavior. The wire guide modules serve to redirect the wire, which usually is fed vertically from above, and to guide it under the bonding tool. Wire guide modules made of POM are designed as a single piece, and usually are produced through primary forming. They melt at approximately 175° C. and are suitable for continuous operation only to just barely above 100° C.

Particularly in thermosonic wire bonders, in which the bonding tool and/or the bond wire and/or the substrate are preheated, for example in order to be able to bond copper wires or to reduce the process times during bonding, the wire guide module also heats up as a result of the thermal energy supplied. Temperatures in the range from 175° C. to 425° C. can be reached at a hottest point of the wire guide module.

SUMMARY OF THE INVENTION

It is therefore an object of the invention to improve a wire guide module with respect to its temperature resistance.

Accordingly, in an exemplary embodiment, the wire guide module comprises a body made of a thermally stable metallic and/or ceramic material, wherein an elongated wire feed-through channel having a wire inlet opening and having a wire outlet opening is provided on the body; a guide tube provided in the wire feed-through channel; and a mount for interlocking positioning of the wire guide module on an attachment element of a bonding head of the ultrasonic wire bonder.

The particular advantage of the invention is in that the body produced from the temperature-stable metallic or ceramic material can even be used at temperatures of up to 425° C. Impermissibly high heating cannot be ascertained. The guide tube that is provided in the wire feed-through channel and through which the bond wire is guided during bonding protects the body of the wire guide module according to the invention from mechanical damage by the likewise metallic wire in this design. The guide tube is designed in this respect as a wearing part and is much lower in cost than the body. At the same time, friction is reduced by the provision of the guide tube that the bond wire can be guided and redirected through the wire guide module with little resistance.

The body of the wire guide module according to the invention can be produced from a cast aluminum alloy or a cobalt chromium tungsten alloy, for example. Good temperature resistance is produced here in each case. For example, a body can be produced from the cobalt chromium tungsten alloy by an additive manufacturing process, which is to say in 3D printing. For example, provision can be made that the body is produced from aluminum oxide.

The guide tube of the wire guide module according to the invention can be produced from polytetrafluoroethylene (PTFE), for example, or from another temperature-stable plastic with a melting temperature of more than 175° C. and preferably more than 240° C. and especially preferably more than 280° C. For example, the guide tube can be made of silicone.

The wire guide module or the body can provide, for example, two opposite flat side surfaces that are essentially parallel to one another, and a circumferential connecting surface that connects the flat side surfaces. The wire inlet opening and/or the wire outlet opening can be formed on the connecting surface.

The wire inlet opening can be provided as part of the mount or immediately adjacent to the mount. The wire outlet opening can be provided at a distance from the mount.

The wire guide module or the body can be wedge-shaped in design with respect to the flat side surfaces and/or the connecting surface and/or can taper toward the wire outlet surface. In this way, it is possible to arrange the wire outlet opening in close proximity to a tip of the bonding tool and to feed the bond wire directly under the bonding tool.

The guide tube can be provided such that it has clearance in the wire feed-through channel. The installation or replacement of the guide tube is advantageously simplified by this means. In addition, a gap between the body and the guide tube ensures that the guide tube is heated less strongly than the body. Alternatively, the guide tube can be matched with respect to its outer diameter to the inner diameter of the wire feed-through channel such that the guide tube is provided such that it has essentially no clearance in the wire feed-through channel.

The wire feed-through channel can taper toward the wire outlet opening. Because the bond wire is fed through the wire inlet opening and pulled toward the wire outlet opening during bonding, the guide tube is secured by the taper of the wire feed-through channel against displacement in the direction of the wire outlet opening or an undesirable sliding out.

A pocketlike and/or trough-shaped installation recess, which may extend to the wire feed-through channel, can be provided on the body. Owing to the provision of the installation recess, the insertion or replacement of the guide tube is facilitated and its correct position in the wire feed-through channel can be optically inspected by visual examination in an especially simple way.

A clamping part can be provided that is inserted in the installation recess and is fixed there in such a manner that the clamping part is in direct contact with the guide tube. The clamping part secures the guide tube in this way. In particular, provision can be made that the clamping part is detachably connected to the body by a fastener. Replacement of the guide tube is simplified in this way, since the clamping part can be detached and removed with the result that changing the guide tube is simplified and the correct position of the guide tube in the wire feed-through channel can be visually inspected prior to reinsertion of the clamping part.

An inert gas channel having an inert gas inlet opening can be provided on the body. In particular the inert gas channel opens into the wire feed-through channel. Advantageously, an inert gas serving as oxidation protection, in particular a noble gas or a noble gas/gas mixture, can be fed through the inert gas channel.

The feeding of the inert gas can be accomplished in such a manner that, for example, the inert gas is fed through the inert gas channel and flows around the guide tube provided such that it has clearance in the wire feed-through channel. The inert gas then exits from the wire feed-through channel by the wire outlet opening.

For example, provision can be made that a through hole is provided in the guide tube on the lateral surface and that the guide tube with the through hole is arranged in the wire feed-through channel and associated with the inert gas channel in such a manner that the inert gas fed through the inert gas channel arrives in the guide tube via the through opening. The provision of the through hole advantageously suggests itself especially when the guide tube is provided such that it has essentially no clearance in the wire feed-through channel.

A longitudinal guide, preferably a dovetail guide, can be provided on the body. The longitudinal guide serves to install the body of the wire guide module according to the invention on an attachment element—provided with a correspondingly shaped mount—of a bonding head of the wire bonder. Advantageously, replacement of the body can be accomplished very easily due to the provision of the longitudinal guide. Furthermore, replacement of the bonding tool is also simplified when the body is displaceably held on the bonding head by the longitudinal guide.

The temperature-resistant wire guide module can be provided, for example replaceably, on a translationally movable and rotatable bonding head of an ultrasonic wire bonder according to claim 15, which has a thermal generator for heating the bonding tool and/or the bond wire and/or a substrate, and has an ultrasonic transducer for exciting ultrasonic vibrations in the bonding tool. Such ultrasonic wire bonders are also referred to as thermosonic wire bonders. An electrically operated heating cartridge, a substrate heater, or a laser generator can be provided as thermal generator, for example.

Additional advantages, features, and details of the invention are evident from the additional dependent claims and the description below. Features mentioned therein can each be essential to the invention individually or in any desired combination. Of course, features and details of the wire guide module described according to the invention also apply in connection with the ultrasonic wire bonder according to the invention and vice versa. Thus, mutual reference can always be made to the disclosure of the individual aspects of the invention. The drawings serve merely to clarify the invention by way of example, and are not restrictive in nature.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 6 is an example of the wire guide module according to the invention in a flat side view, FIG. 7 is the wire guide module from FIG. 6 in a sectional representation, FIG. 8 is the wire guide module from FIGS. 6 and 7 with the bond wire guided therein.

DETAILED DESCRIPTION

Figure 1:
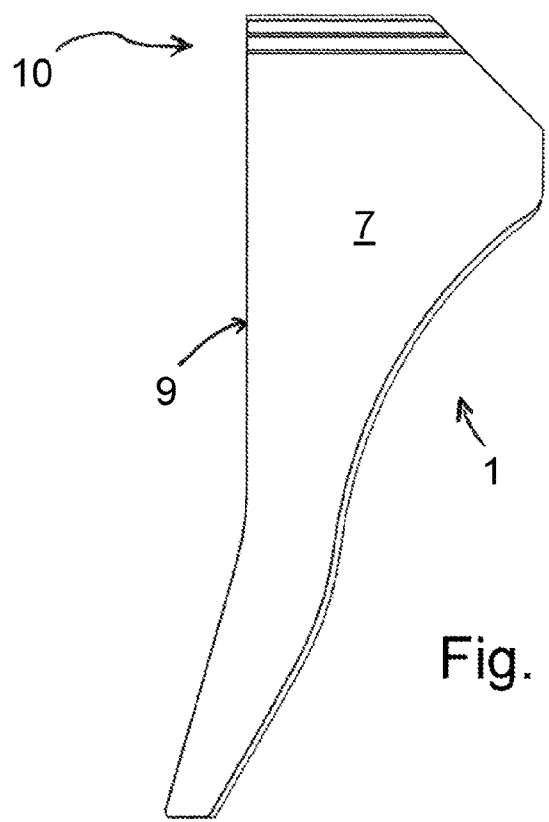
FIG. 1 is a flat side view of a wire guide module according to the invention in an example.
Figure 2:
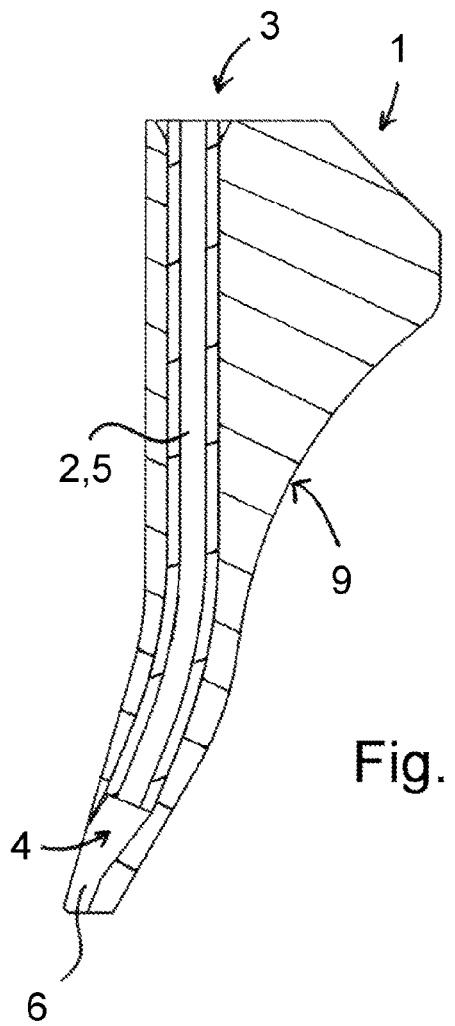
FIG. 2 is a sectional representation of the wire guide module from FIG. 1.
Figure 3:
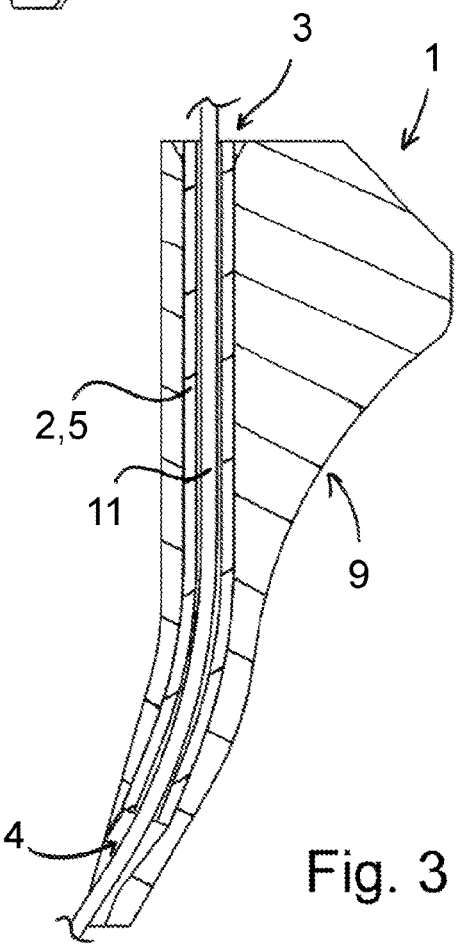
FIG. 3 is the wire guide module from FIGS. 1 and 2 with a bond wire guided therein.
Figure 4:
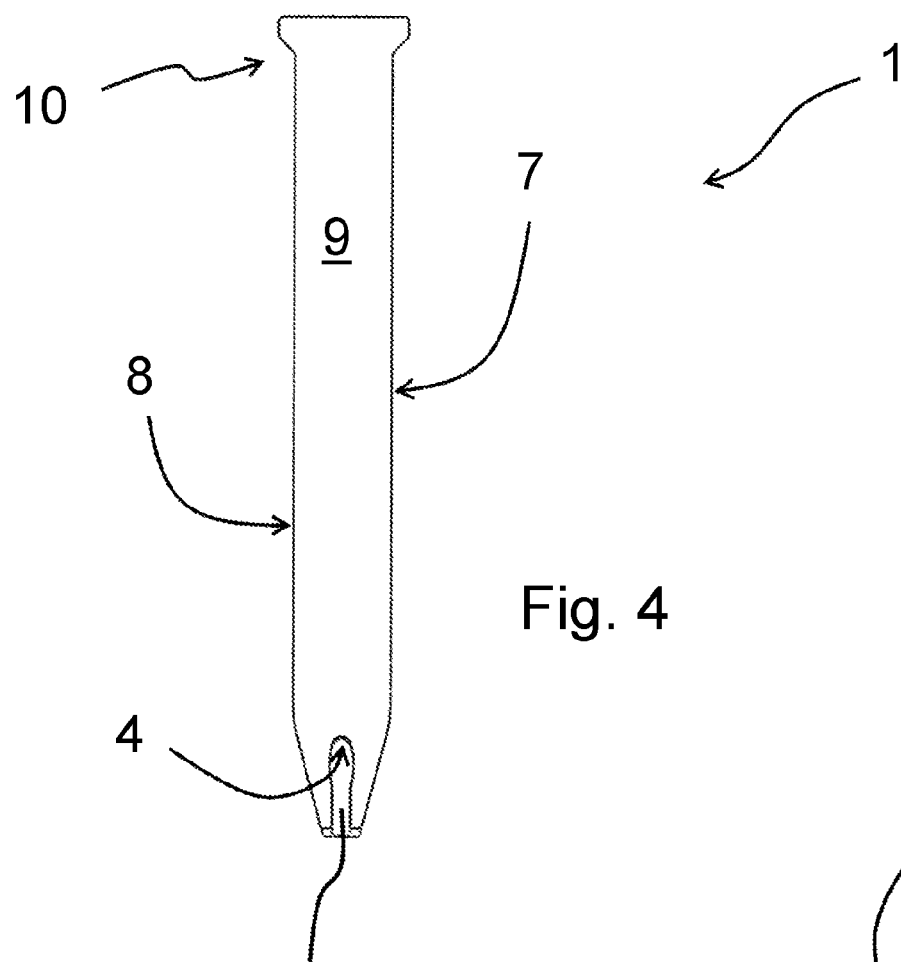
FIG. 4 is a front face view of the wire guide module from FIGS. 1 to 3.

A first embodiment of a wire guide module according to the invention from FIGS. 1 to 4 provides a body 1, which is produced from a thermally stable metallic or ceramic material, for example from a cast aluminum alloy, a cobalt chromium tungsten alloy, or from aluminum oxide. The body 1 has two opposite flat side surfaces 7, 8, and a circumferential connecting surface 9 that connects the two flat side surfaces 7, 8.

Provided on the body 1 is a wire feed-through channel 2 for a bond wire 11. The wire feed-through channel 2 provides a wire inlet opening 3 located in the region of the connecting surface 9 as well as a wire outlet opening 4. A groove-shaped outlet contour 6, which the wire feed-through channel 2 opens into and which adjoins the wire outlet opening 4, is additionally provided as part of the connecting surface 9.

Provided in the wire feed-through channel 2 is a guide tube 5. The guide tube 5 is made of a plastic with a melting temperature of more than 175° C. and preferably more than 240° C. and especially preferably more than 280° C. In the present case, the guide tube 5 is made of PTFE. The guide tube 5 is provided such that it has essentially no clearance in the wire feed-through channel 2.

In order to guide the bond wire 11 to a bonding tool and position it under a tip of the bonding tool, the bond wire 11, which, in particular, is fed vertically through the wire inlet opening 3, is redirected in the wire feed-through channel 2 toward the bonding tool. The bond wire 11 leaves the wire feed-through channel 2 through the wire outlet opening 4, which is arranged at an incline to the bonding tool and arrives in the groove-shaped outlet contour 6 of the wire guide module, which contour is open toward the bonding tool.

For the purpose of installing the wire guide module according to the invention on a bonding head of the wire bonder, the wire guide module provides a longitudinal guide, in the present case a dovetailed longitudinal guide, as a mount 10. The longitudinal guide 10 is provided on the body 1 of the wire guide module 1. It extends in the region of the opposing flat side surfaces 7, 8 and, at the same time, surrounds the wire inlet opening 3 of the wire feed-through channel 2.

Figure 5:
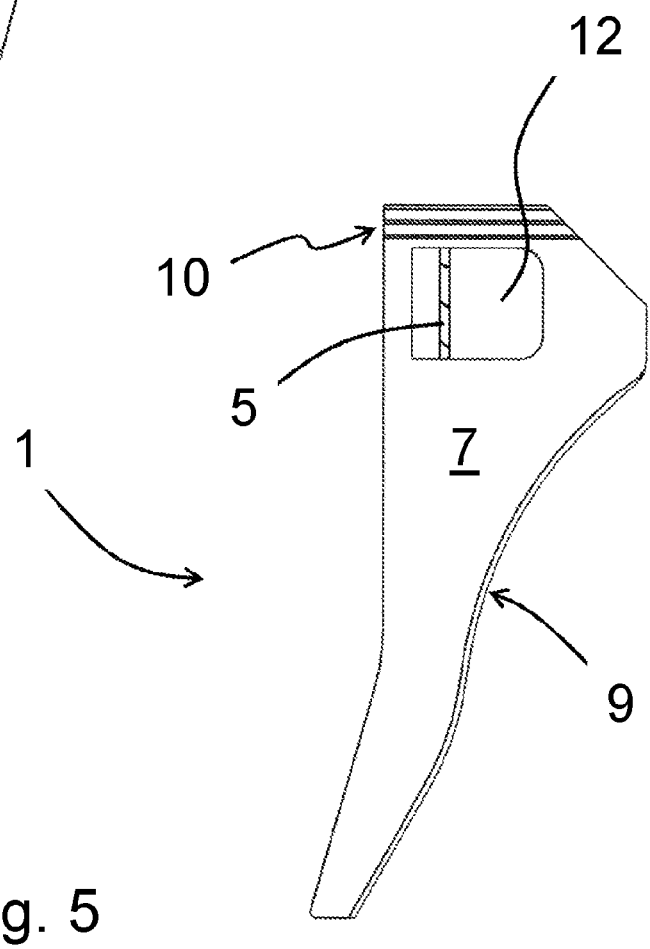
FIG. 5 is an example of the wire guide module according to the invention in a flat side view.
Figure 9:
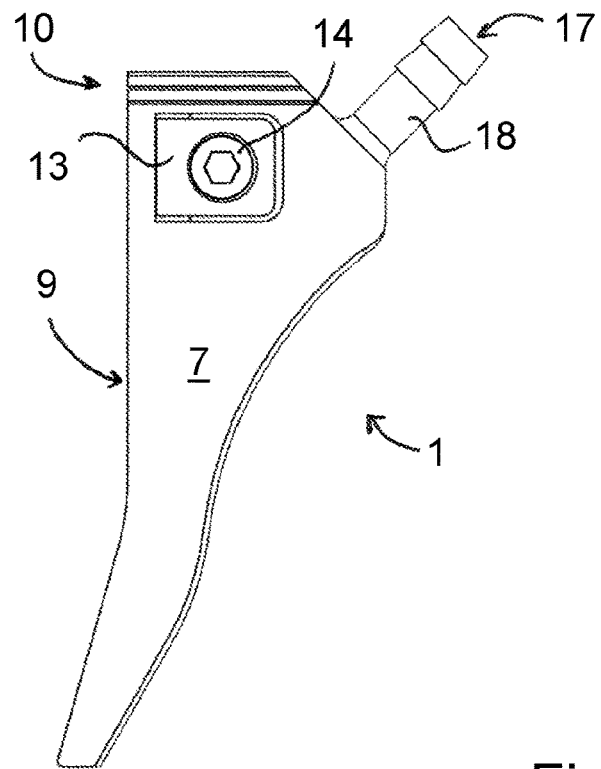
FIG. 9 is an example of the wire guide module according to the invention in a flat side view.
Figure 10:
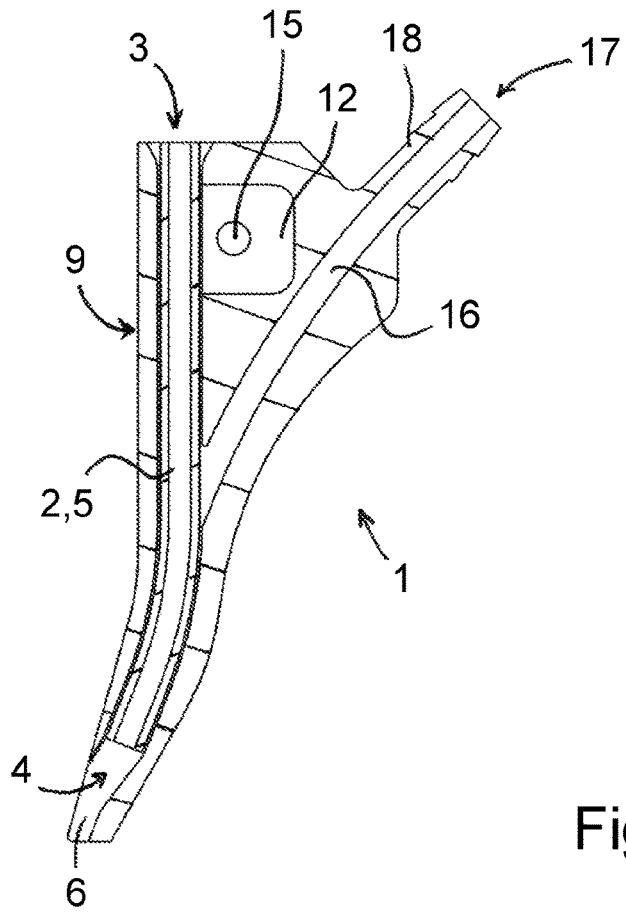
FIG. 10 is the wire guide module from FIG. 9 in a sectional representation.
Figure 11:
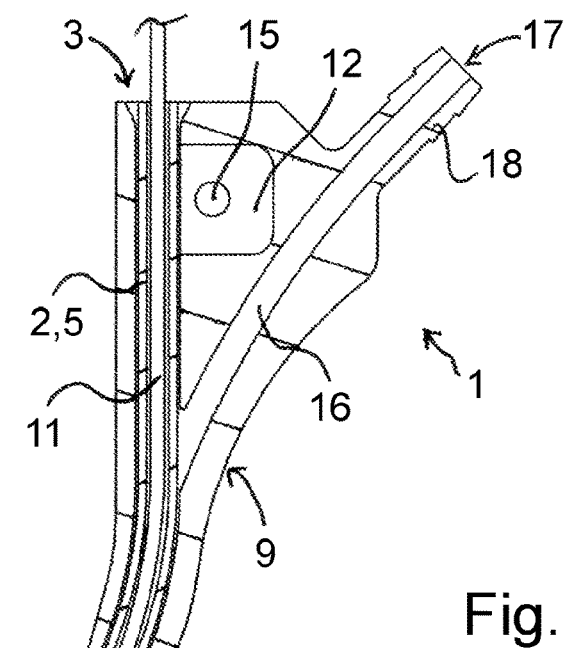
FIG. 11 is the wire guide module from FIGS. 9 and 10 with the bond wire guided therein.
Figure 12:
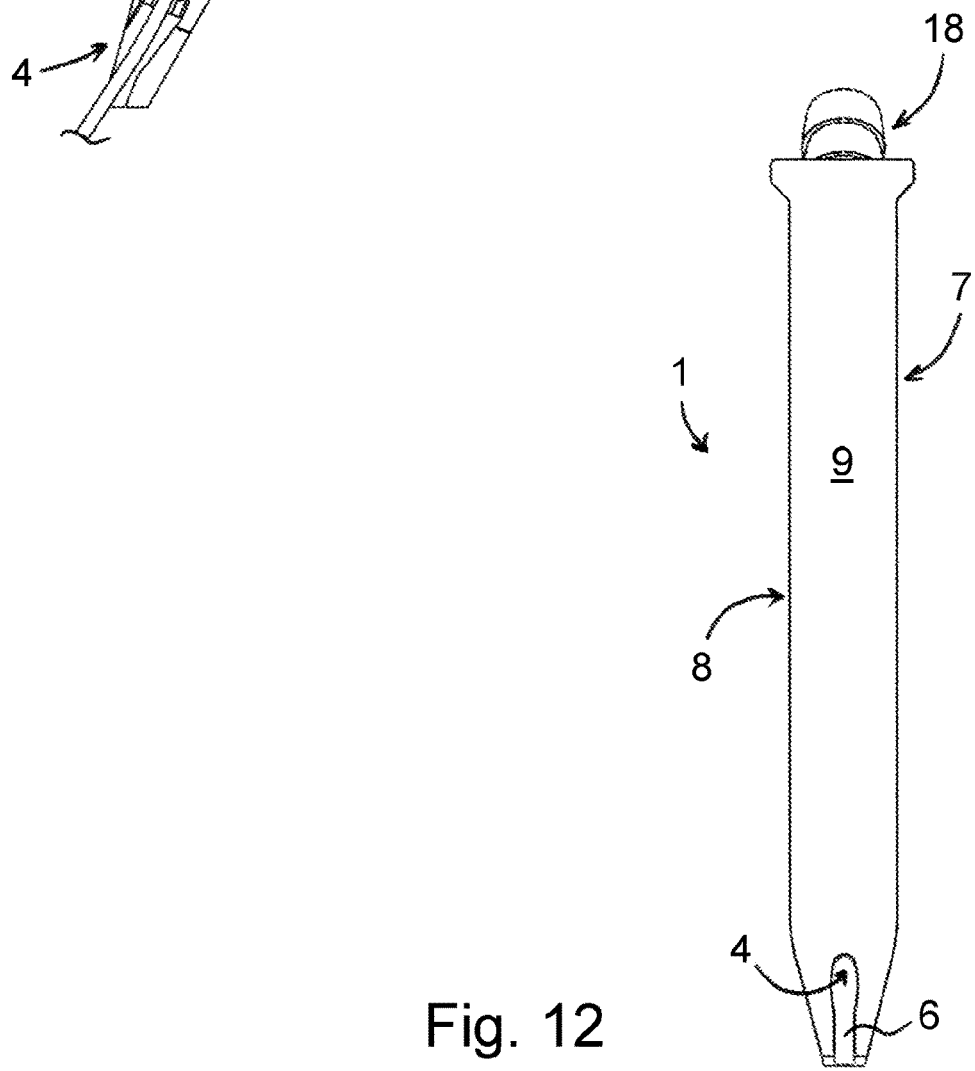
FIG. 12 is a front face view of the wire guide module from FIGS. 9 to 11.

FIG. 5 shows a second embodiment of the invention with a body 1 that provides an installation recess 12 on the first flat side surface 7, which recess is routed to the wire feed-through channel 2. The installation recess 12 is provided in order to simplify the installation of the guide tube 5 in the wire feed-through channel 2, on the one hand. On the other hand, a correct positioning of the guide tube 5 in the wire feed-through channel 2 can be visually inspected by visual examination. The guide tube 5 in this case is preferably provided such that it has essentially no clearance in the wire feed-through channel 2. The installation recess 12 can be formed as a through recess or be pocketlike or trough-shaped.

According to a third embodiment of the invention from FIGS. 6 to 8, the installation recess 12, which extends to the wire feed-through channel 2, is formed on the body 1 of the wire guide module according to the invention in the region of the first flat side surface 7. A clamping part 13 is inserted in the installation recess 12, which is pocketlike or trough-shaped in the present case. The clamping part 13 is fixed in position by a screw 14, which engages in a screw receptacle 15 formed on the body 1. In the installed state of the wire guide module, the clamping part 13 serves to secure, fix, or position the guide tube 5 that is provided such that it has clearance in the wire feed-through channel 2. At the same time, the clamping part 13 can be removed. Removal or installation of the guide tube 5 is simplified by this means, since exact positioning of the guide tube 5 in the wire feed-through channel 2 of the body 1 can be visually inspected on account of the installation recess 12 formed on the body 1. The installation recess 12 has a dual function in this respect. It serves on the one hand to simplify installation and removal of the guide tube 5, and on the other hand to accommodate the clamping part 13 that is provided for securing the guide tube 5.

FIGS. 9 to 12 show a fourth embodiment of the wire guide module according to the invention. In this design, an inert gas channel 16, which provides an inert gas inlet opening 17 and is routed to the wire feed-through channel 2, is formed on the body 1 in addition to the wire feed-through channel 2 and the installation recess 12. The inert gas inlet opening 17 is part of a connector 18 that is provided on the connecting surface 9 and serves to connect an inert gas line. A gas that serves the purpose of oxidation protection, in particular a noble gas or a noble gas mixture, can be fed through the inert gas channel 16. In the present exemplary embodiment of the invention, the guide tube 5 is provided such that it has clearance in the wire feed-through channel 2. The inert gas fed through the inert gas channel 16 arrives in the wire feed-through channel 2 and flows around the guide tube 5 on the lateral surface. Some of the inert gas preferentially exits through the wire outlet opening 4 and inhibits the reaction of the bond wire 11 and/or of the substrate (weld joint partners) with the environment or with the oxygen in the ambient air during processing of the bond wire 11, which is to say during production of the friction-welded connection.

The preferred exit of the inert gas through the wire outlet opening 4 is accomplished by the means that the inert gas channel 16 is routed to the wire feed-through channel 2 at an acute angle, and the inert gas preferentially flows toward the wire outlet opening 4 due to the inclination of the inert gas channel 16 in the region of the opening.

Figure 13:
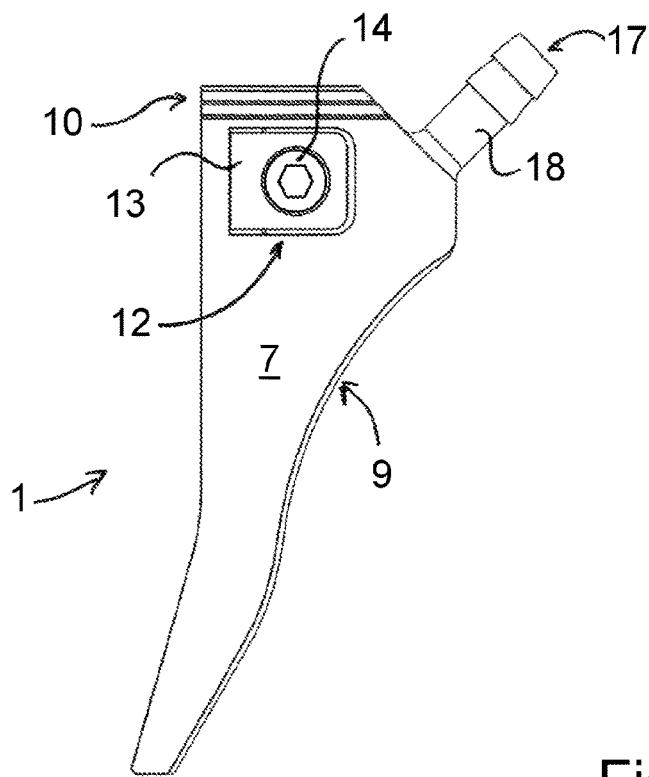
FIG. 13 is an example of the wire guide module according to the invention in a flat side view.
Figure 14:
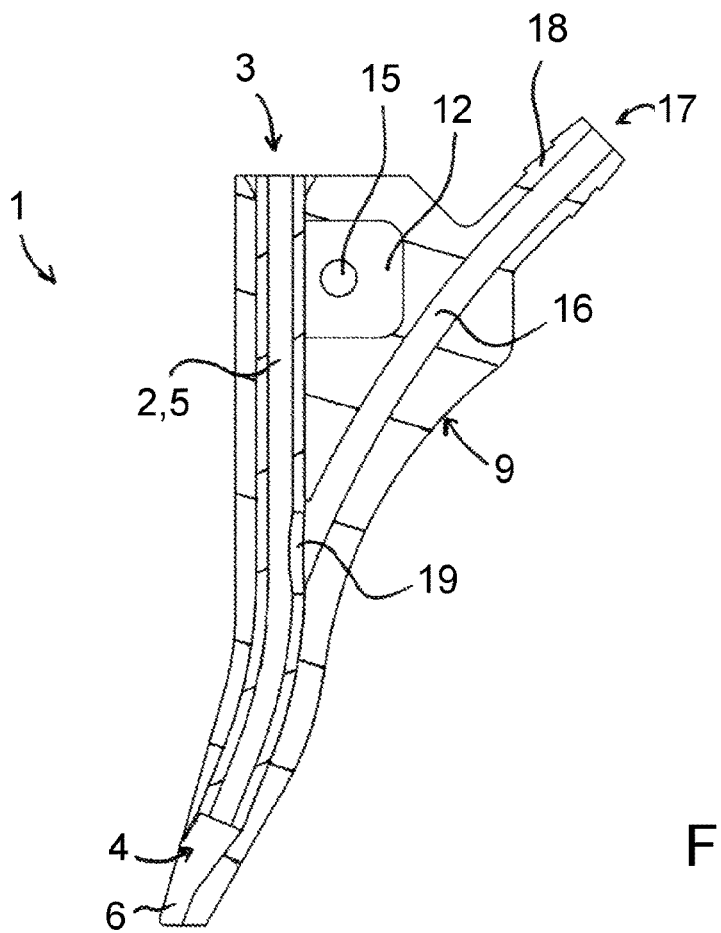
FIG. 14 is the wire guide module from FIG. 13 in a sectional representation.
Figure 15:
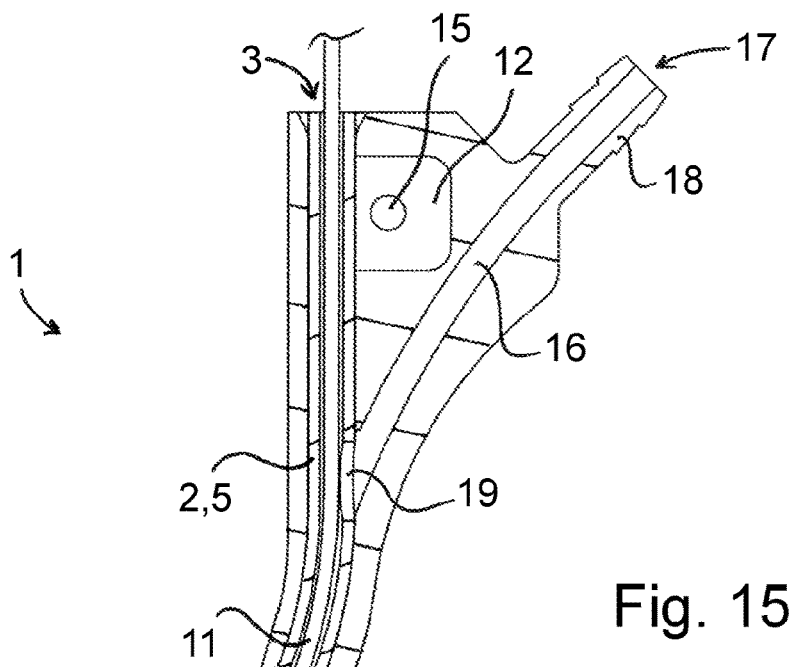
FIG. 15 is the wire guide module from FIGS. 13 and 14 with the bond wire guided therein.
Figure 16:
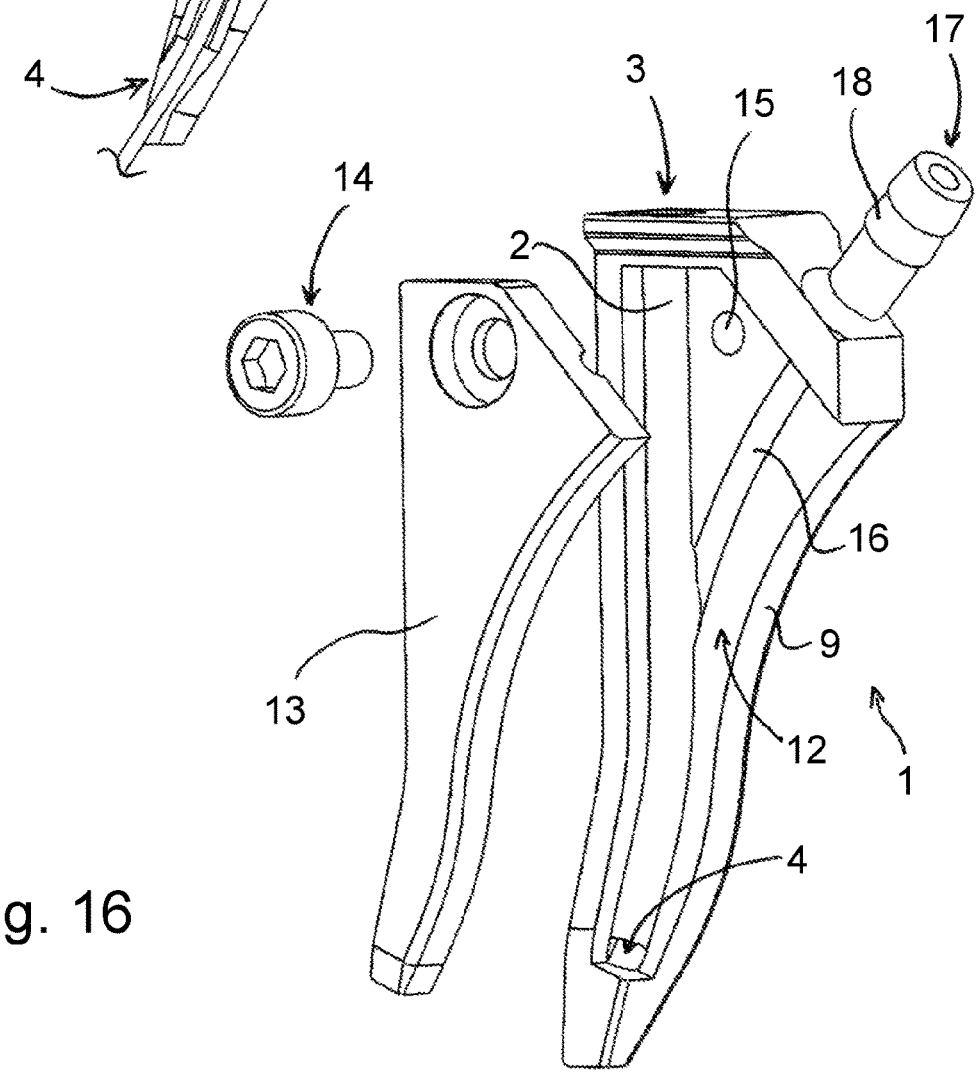
FIG. 16 is an example of the wire guide module according to the invention in a perspective, exploded view.
Figure 17:
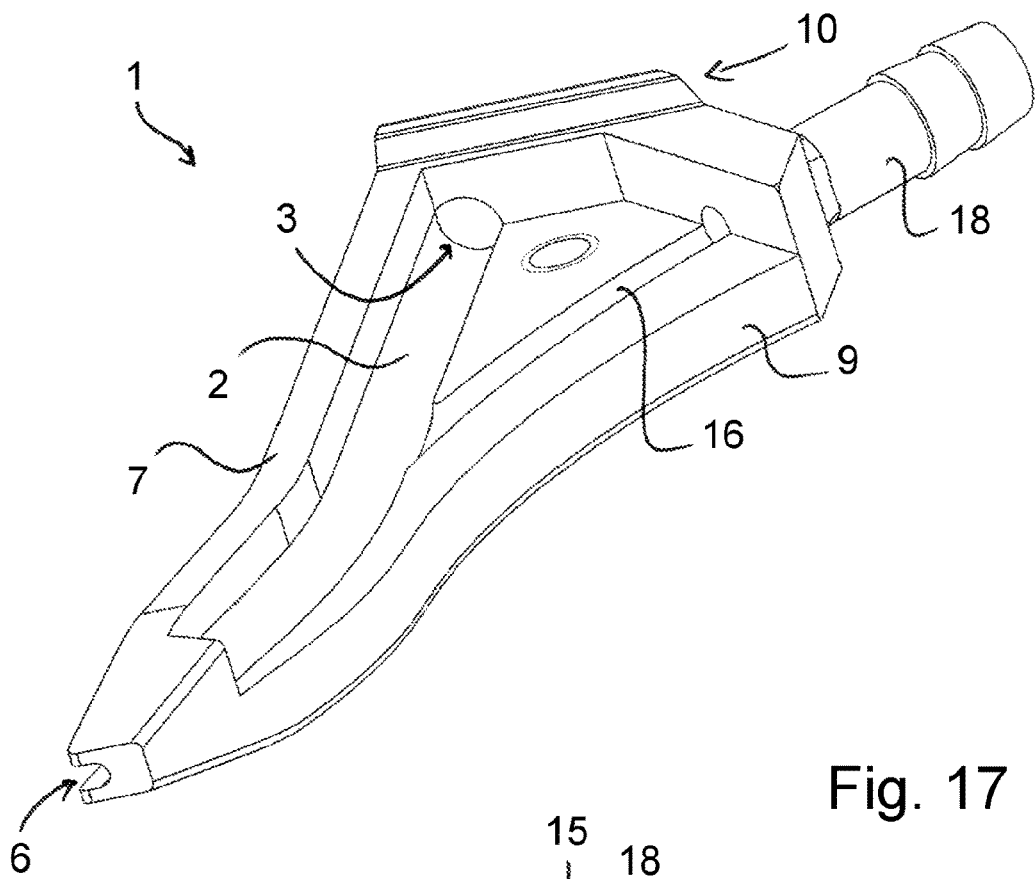
FIG. 17 is a perspective view of a body of the wire guide module from FIG. 16.
Figure 18:
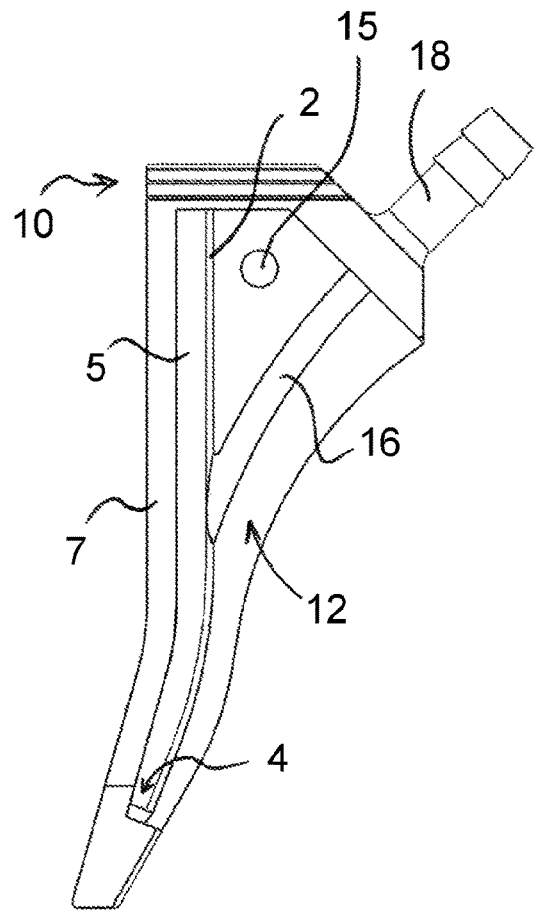
FIG. 18 is a flat side view of the body from FIG. 17 with a guide tube provided therein.
Figure 19:
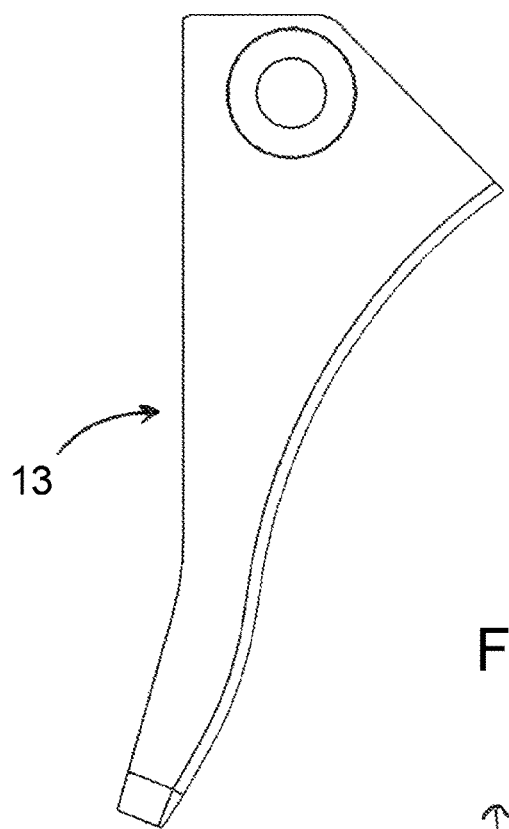
FIG. 19 is a flat side view of a clamping part of the wire guide module from FIG. 16.
Figure 20:
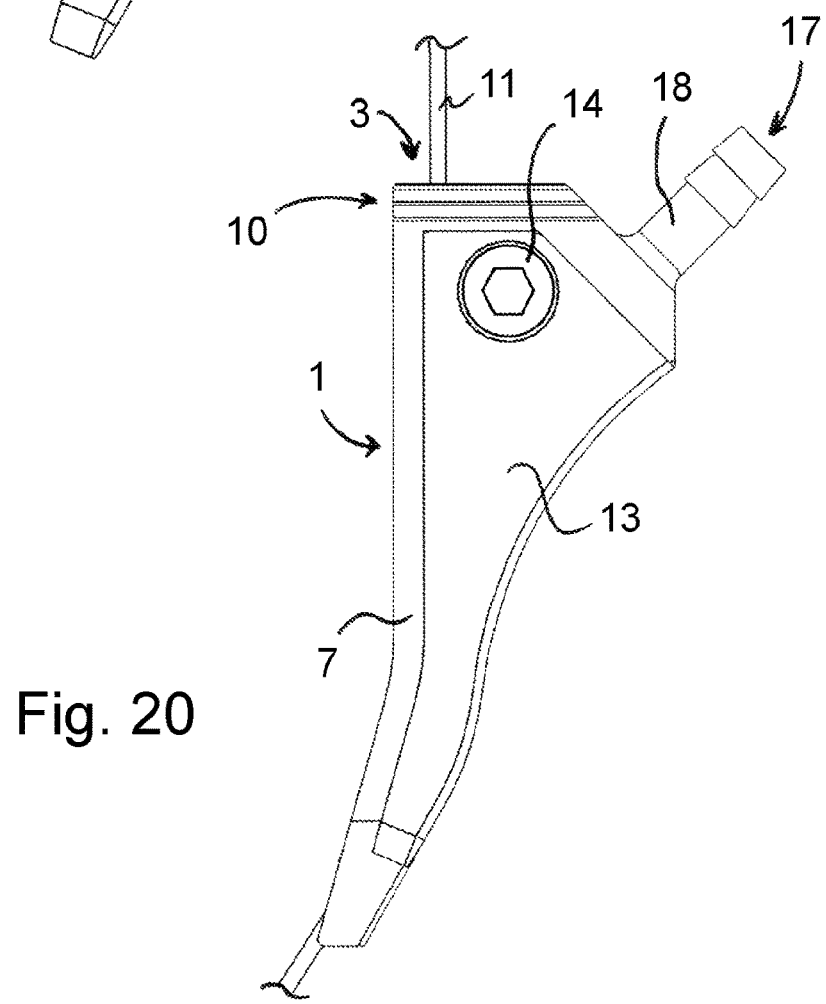
FIG. 20 is a flat side view of the wire guide module from FIG. 16 with a bond wire guided therein.

In a fifth embodiment of the invention from FIGS. 13 to 15, the wire guide module also provides an inert gas channel 16. At the same time, the guide tube 5 is held with essentially no clearance in the wire feed-through channel 2. In order to cause the inert gas fed through the inert gas channel 16 to exit through the wire outlet opening 4, a through opening 19 is provided in the guide tube 5 on the lateral surface. The guide tube 5 with the through opening 19 is now arranged in the wire feed-through channel 2 and associated with the inert gas channel 16 in such a manner that the inert gas fed through the inert gas channel 16 arrives in the guide tube 5 through the through opening 19 and can escape via the wire outlet opening 4.

According to a sixth embodiment of the invention from FIGS. 16 to 20, the wire guide module provides the body 1 having the wire feed-through channel 2 formed therein and the clamping part 13, which is inserted in the installation recess 12 formed on the body 1. In the sixth exemplary embodiment of the invention, the installation recess 12 is implemented in such a manner that it extends from the first flat side surface 7 to the connecting surface 9. In this respect, the installation recess 12 allows still further simplified removal or installation of the guide tube 5. Otherwise, the clamping part 13 is fixed to the body 1 of the wire guide module by the screw 14 as before.

The new structural or functional features of the respective wire guide module are discussed in each of the exemplary embodiments two through six of the invention, whereas functional or structural features of a preceding embodiment of the invention that have already been described and incorporated are not discussed again. Identical components and component functions are labeled with identical reference symbols here.

The invention is not limited to the exemplary embodiments shown. For example, provision can be made that the installation recess is provided solely in the region of the connecting surface and/or extends in a direction in which the wire feed-through channel extends.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A wire guide module for an ultrasonic wire bonder, the wire guide module comprising:
   a body made of a thermally stable metallic and/or ceramic material;

an elongated wire feed-through channel provided in the body, the wire feed-through channel having a wire inlet opening and a wire outlet opening; and a guide tube arranged in the wire feed-through channel, wherein, with respect to a feed-through direction of a bond wire in the wire feed-through channel, a downstream distal end of the guide tube terminates upstream of the wire outlet opening, and wherein the body has an installation recess, the installation recess being an opening that is provided in addition to the wire inlet opening and the wire outlet opening and that exposes a part of the wire feed-through channel to aid with installation of the guide tube in the wire feed-through channel.

2. The wire guide module according to claim 1, wherein a clamping part is provided that is inserted in the installation recess and is fixed in the installation recess, wherein the clamping part is in direct contact with the guide tube in order to secure and/or fix and/or position the guide tube in the wire feed-through channel.

3. The wire guide module according to claim 1, wherein an inert gas channel having an inert gas inlet opening is provided in the body for feeding an inert gas.

4. The wire guide module according to claim 3, wherein the inert gas channel opens into the wire feed-through channel and/or wherein the inert gas channel is routed to the wire feed-through channel at an acute angle such that inert gas flows toward the wire outlet opening due to an inclination of the inert gas channel in a region of an opening.

5. The wire guide module according to claim 3, wherein a mount is provided for interlocking positioning of the wire guide module on an attachment element of a bonding head of the ultrasonic wire bonder or wherein a longitudinal guide is provided on the body as a mount for installing the body on a correspondingly shaped attachment element of the bonding head of the ultrasonic wire bonder, the longitudinal guide being formed as a dovetail guide.

6. The wire guide module according to claim 5, wherein the wire inlet opening is provided in a region of the mount and/or is surrounded thereby, or wherein the wire outlet opening is opposite the mount.

7. The wire guide module according to claim 1, wherein the body has a first flat side surface and a second flat side surface opposite the first flat side surface, as well as a circumferential connecting surface that connects the first flat side surface to the second flat side surface, wherein the installation recess is formed on the first flat side surface or in a region of the first flat side surface and the connecting surface, and wherein the wire inlet opening and/or the wire outlet opening and/or the inert gas inlet opening are provided in the connecting surface.

8. The wire guide module according to claim 7, wherein a groove-shaped outlet contour, which the wire feed-through channel opens into and/or which adjoins the wire outlet opening, is formed as part of the connecting surface.

9. A wire guide module for an ultrasonic wire bonder, the wire guide module comprising:
a body made of a thermally stable metallic and/or ceramic material;
an elongated wire feed-through channel provided in the body, the wire feed-through channel having a wire inlet opening and a wire outlet opening; and
a guide tube arranged in the wire feed-through channel, wherein, with respect to a feed-through direction of a bond wire in the wire feed-through channel, a downstream distal end of the guide tube terminates upstream of the wire outlet opening,
wherein an inert gas channel having an inert gas inlet opening is provided in the body for feeding an inert gas, and
wherein the guide tube has a through opening on a lateral surface, and wherein the guide tube is arranged in the wire feed-through channel and associated with the inert gas channel such that inert gas fed through the inert gas channel enters the guide tube through the through opening.

10. An ultrasonic wire bonder comprising:
a linearly and/or rotationally movable bonding head, wherein a bonding tool that is adapted to be excited into ultrasonic vibrations via an ultrasonic transducer is replaceably held on the bonding head;
a thermal generator for heating the bonding tool and/or the bond wire and/or a substrate; and
a wire guide module that is formed as part of the bonding head for feeding the bond wire to the bonding tool,
wherein the wire guide module comprises:
a body made of a thermally stable metallic and/or ceramic material;
an elongated wire feed-through channel provided in the body, the wire feed-through channel having a wire inlet opening and a wire outlet opening; and
a guide tube arranged in the wire feed-through channel, wherein, with respect to a feed-through direction of a bond wire in the wire feed-through channel, a downstream distal end of the guide tube terminates upstream of the wire outlet opening,
wherein the bonding tool is provided in addition to the wire quide module, and
wherein, from the wire inlet opening to the wire outlet opening, the wire feed-through channel is configured so as to circumferentially surround the bond wire.

11. The ultrasonic wire bonder according to claim 10, wherein, the guide tube is flexible and is made of a plastic with a melting temperature of more than 175° C.

12. The ultrasonic wire bonder according to claim 10, wherein the body is made of a cast aluminum alloy or a cobalt chromium tungsten alloy and/or wherein the body is made of aluminum oxide.

13. The ultrasonic wire bonder according to claim 10, wherein the guide tube is flexible, and/or wherein the guide tube is made of a plastic with a melting temperature of more than 175° C., and/or wherein the guide tube is made of PTFE.

14. The ultrasonic wire bonder according to claim 10, wherein the guide tube has a clearance in the wire feed-through channel.

15. The ultrasonic wire bonder according to claim 10, wherein the wire feed-through channel tapers toward the wire outlet opening.

* * * * *